United States Patent
Kawamura et al.

(10) Patent No.: US 7,977,675 B2
(45) Date of Patent: Jul. 12, 2011

(54) SEMICONDUCTOR DEVICE AND METHOD FOR MANUFACTURING THE SAME

(75) Inventors: Tetsufumi Kawamura, Kodaira (JP); Takeshi Sato, Kokubunji (JP); Mutsuko Hatano, Kokubunji (JP); Hiroyuki Uchiyama, Musashimurayama (JP)

(73) Assignee: Hitachi, Ltd., Tokyo (JP)

( * ) Notice: Subject to any disclaimer, the term of this patent is extended or adjusted under 35 U.S.C. 154(b) by 0 days.

(21) Appl. No.: 12/423,053

(22) Filed: Apr. 14, 2009

(65) Prior Publication Data

US 2009/0261325 A1    Oct. 22, 2009

(30) Foreign Application Priority Data

Apr. 16, 2008  (JP) .................................. 2008-106586

(51) Int. Cl.
*H01L 29/12*    (2006.01)

(52) U.S. Cl. .................. 257/43; 257/369; 257/E27.062; 257/E21.633

(58) Field of Classification Search .................... 257/43, 257/368, 369, E27.062, E21.618, E21.633
See application file for complete search history.

(56) References Cited

U.S. PATENT DOCUMENTS

| 2007/0054507 A1 | 3/2007 | Kaji et al. |
| 2008/0073653 A1 * | 3/2008 | Iwasaki ............................ 257/79 |
| 2008/0197350 A1 * | 8/2008 | Park et al. ........................ 257/43 |
| 2009/0167974 A1 * | 7/2009 | Choi et al. ....................... 349/43 |

FOREIGN PATENT DOCUMENTS

| JP | 2007-073699 | 3/2007 |
| JP | 2007-250983 | 9/2007 |
| WO | WO 2007/119386 A1 | 10/2007 |

* cited by examiner

*Primary Examiner* — Victor Mandala
*Assistant Examiner* — Scott Stowe
(74) *Attorney, Agent, or Firm* — Antonelli, Terry, Stout & Kraus, LLP.

(57) ABSTRACT

A metallic oxide semiconductor device with high performance and small variations. It is a field effect transistor using a metallic oxide film for the channel, which includes a channel region and a source region and comprises a drain region with a lower oxygen content than the channel region in the metallic oxide, in which the channel region exhibits semiconductor characteristics and the oxygen content decreases with depth below the surface.

13 Claims, 7 Drawing Sheets

SEMICONDUCTOR DEVICE AND METHOD FOR MANUFACTURING THE SAME

CLAIM OF PRIORITY

The present application claims priority from Japanese patent application JP 2008-106586 filed on Apr. 16, 2008, the content of which is hereby incorporated by reference into this application.

FIELD OF THE INVENTION

The present invention relates to a semiconductor device and a method for manufacturing the same and more particularly to a field-effect transistor using a metallic oxide film for a channel and a manufacturing method thereof.

BACKGROUND OF THE INVENTION

Recently, attempts have been made to form a field-effect transistor (hereinafter, it may be called simply FET in this specification) using a metallic oxide film for a channel layer. Especially, thin film transistors, using ZnO, InGaZnO, and ZnSnO, etc. for a channel layer (hereinafter, it may be called simply TFT in this specification) have been developed. However, the main motive thereof is that the manufacturing process being performed at low temperatures and being simple. Research and development have been actively pursued for forming TFT directly over a so-called flexible film such as a plastic film, by taking the advantage of this low temperature and the feature of simplicity.

Recently, the TFT most widely used is one using an amorphous or polycrystalline silicon for the channel layer. However, there is a problem that a high temperature process is necessary for manufacturing devices of a silicon TFT and is unsuitable for manufacturing over a flexible substrate.

In an oxide TFT, a source electrode and a drain electrode are formed by having a conductive film made of a material such as a metal and ITO (Indium Tin Oxide), which are different from the channel layer, contact with the channel layer. Therefore, the contact resistance between the metallic oxide film which is a semiconductor and the conductive film, and the parasitic resistance between the channel region and the source electrode or the drain electrode become a reason for preventing an improvement in the TFT characteristics. Moreover, when the contact resistance and the parasitic resistance are high, the variations thereof becomes a big factor of the variations in the TFT characteristics and it is a reason for preventing performance improvement when a circuit and display device, etc. are manufactured. Especially, in an organic LED (Organic Light Emitting Diode: OLED) display device using the TFT in an analog manner, variations in the TFT makes the image quality deteriorate.

For these reasons, in the oxide TFT, it is required to decrease the contact resistance and the parasitic resistance and to decrease the variations thereof.

In order to solve the above-mentioned problems, JP-A-2007-073699 and JP-A-2007-250983 disclose a means for decreasing the contact resistance and the distribution thereof by increasing the conductivity of the desired region in the metallic oxide film and forming the source region and the drain region. It is also disclosed that the parasitic resistance and the variations thereof are decreased by forming the source region and the drain region self-aligned.

It is known that the conductivity of the metallic oxide film can be controlled by the oxygen content and the impurity hydrogen content in the film, and it is used in the above-mentioned JP-A-2007-073699 and JP-A-2007-250983. In the metallic oxide film, since the oxygen defects or impurity hydrogen work as n-type donors and carrier electrons are created in the film, the conductivity becomes higher and the film resistance lower as the oxygen content decreases or the hydrogen content increases.

SUMMARY OF THE INVENTION

JP-A-2007-073699 discloses a method in which oxygen defects are created by irradiating short-wavelength light or high energy particles to a desired region in the metallic oxide film, resulting in the formation of the source region and the drain region, thereby, the contact resistance and the variations thereof are decreased. According to a disclosed manufacturing method of a top-gate type TFT, the parasitic resistance and the distribution thereof can be decreased because the source and the drain regions are formed self-aligned to the gate electrode.

However, in a method disclosed in JP-A-2007-073699, since the carrier concentration in the channel region is determined while depositing the metallic oxide film, there is a problem that the threshold voltage (Vth) of the TFT cannot be controlled in the subsequent processes, for instance, after the source region and drain region or source electrode and drain electrode are formed. Therefore, there is a problem that a reduction in yield easily occurs in the case of mass-production of a TFT and, for instance, that process corrections are difficult when there is a change in the product type to which the TFT is applied. Moreover, there is another problem that it is impossible to manufacture TFTs having different threshold voltages (Vth) over the same substrate and the degree of freedom of the circuit design is low. In addition, although the bottom-gate type TFT is generally easy to manufacture and suitable for mass-production, there is a problem that it is impossible to manufacture the bottom-gate type TFT by using the disclosed method.

On the other hand, in JP-A-2007-250983, a method is disclosed in which the source region and the drain region is formed by introducing hydrogen or deuterium into the desired region in the metallic oxide film, resulting in the contact resistance and the variations thereof being decreased. In the case of a manufacturing method of the top-gate type TFT disclosed therein, the source region and the drain region are formed self-aligned to the gate electrode and, in the case of the bottom-gate type TFT, the source region and the drain region are formed self-aligned to the source electrode and the drain electrode, resulting in the parasitic resistance and the variations thereof also being decreased.

However, even in a method disclosed in JP-A-2007-250983, since the carrier concentration in the channel region is determined while depositing the metallic oxide film, there is a problem that the threshold voltage (Vth) of the TFT cannot be controlled in subsequent processes, for instance, after the source region and drain region or source electrode and drain electrode are formed. Therefore, there is a problem that a reduction in yield easily occurs in the case of mass-production of a TFT and, for instance, that process corrections are difficult when there is a change in the product type to which the TFT is applied. Moreover, in both structures of the top-gate type and the bottom-gate type, there is another problem that it is impossible to manufacture TFTs having different Vth over the same substrate and the degree of freedom of the circuit design is low. Furthermore, in the case of the disclosed bottom-gate type TFT, since the channel region is exposed to an organic solvent in the lift-off process, the deterioration of the characteristics and the increase of the distribution cannot be avoided. Specifically, there is concern that the back channel is formed by extracting oxygen from the surface of the channel region according to a chemical reaction with the organic solvent and by penetrating hydrogen in the organic solvent into the channel region. The back channel is a current path formed at the opposite surface of the gate electrode in the channel region and it causes an increase in the off-leak current.

The present invention is performed on the basis of such conditions, and the object thereof are as follows.

It is the first object of the present invention to provide a semiconductor device and a manufacturing method thereof wherein the contact resistance, the parasitic resistance, and the variations thereof are small.

It is the second object of the present invention to provide a semiconductor device and a manufacturing method thereof wherein Vth can be controlled after a source region and a drain region or a source electrode and a drain electrode are formed.

It is the third object of the present invention to provide a semiconductor device and a manufacturing method thereof wherein oxide FETs having different Vth can be formed over the same substrate.

It is the fourth object of the present invention to provide a semiconductor device and a manufacturing method thereof wherein the formation of a back-channel can be controlled.

An outline of a typical example of the invention disclosed in the present application will be briefly described as follows:
(1) A semiconductor in accordance with the present invention is, for instance, a field-effect transistor using a metallic oxide for a channel, in which the metallic oxide includes a channel region and includes a source region and a drain region having a lower oxygen content and higher conductivity than the channel region, and in which the channel region exhibits semiconductor characteristics and the oxygen content decreases with depth below the surface.
(2) A semiconductor device in accordance with the present invention is, for instance, a bottom-gate type thin film transistor on the assumption of the configuration described in (1), in which a gate electrode, a gate insulator film, a metallic oxide film are formed, in order, over a substrate, and a source electrode and a drain electrode are formed thereon, in which the region for superimposing the source electrode is the source region in the metallic oxide film, in which the region for superimposing the drain electrode is the drain region in the metallic oxide film, and in which the region between the drain region and the source region is the channel region in said metallic oxide film.
(3) A manufacturing method of a semiconductor device in accordance with the present invention is characterized by forming a channel region having a higher oxygen content than the source region and the drain region in a semiconductor device described in (2), in which the source electrode and the drain electrode are used for a mask, and oxygen is introduced into the metallic oxide film between the source electrode and the drain electrode.
(4) A semiconductor device in accordance with the present invention is a top-gate type thin film transistor on the assumption of the configuration described in (1), in which the metallic oxide film is formed over a substrate, a source electrode and a drain electrode are formed thereon and, further thereon, a gate insulator film and a gate electrode are formed, in order, in which the region for superimposing the source electrode is the source region in said metallic oxide film, in which the region for superimposing the drain electrode is the drain region in said metallic oxide film, and in which the region between the drain region and said source region is the channel region in said metallic oxide film.
(5) A manufacturing method of a semiconductor device in accordance with the present invention is characterized by forming a channel region having a higher oxygen content than the source region and the drain region in a semiconductor device described in (4), in which the source electrode and the drain electrode are used for a mask, and oxygen is introduced into the metallic oxide film between the source electrode and the drain electrode.
(6) A manufacturing method of a semiconductor device in accordance with the present invention is for a top-gate type thin film transistor in which a source electrode and a drain electrode are formed over a substrate, and on top of these, the metallic oxide film, a gate insulator film, and a gate electrode are formed, in order, in which after forming the metallic oxide film, a channel region having a higher oxygen content than the source region and the drain region is formed by forming a mask opening a channel-forming region of the metallic oxide film and by introducing oxygen to the metallic oxide from the opening.
(7) A manufacturing method of a semiconductor device described in (3) above, in which introduction of oxygen is carried out by any of oxygen plasma irradiation, oxygen atmosphere anneal, and radical oxidation.
(8) A semiconductor device according to the present invention includes plural semiconductor devices using a metallic oxide film for a channel formed over the same substrate, and a first group semiconductor device having a high threshold voltage and a second group semiconductor device having a low threshold voltage, in which at least a first group semiconductor device is comprised of a semiconductor device shown in (1).
(9) A semiconductor device according to the present invention assumes the configuration of (8), in which at least one more insulator film from the insulator film over the channel region of the first group semiconductor device is formed over the channel region of the second group semiconductor device.
(10) A manufacturing method of a semiconductor device according to the present invention is one in which the first group semiconductor device having a high threshold voltage and the second group semiconductor device having a low threshold voltage are formed over the same substrate,
in which a protection film is formed over the channel region of the first semiconductor device and a manufacturing method described in (3) above is applied to the manufacture of the second group semiconductor device.
(11) A manufacturing method of a semiconductor device according to the present invention is one in which the first group semiconductor device having a high threshold voltage and the second group semiconductor device having a low threshold voltage are formed over the same substrate, in which a manufacturing method described in (3) above is applied to the second group semiconductor device, and a protection film is formed over the channel region of the second group semiconductor device, and in which a manufacturing method described in (3) above is applied to the second group semiconductor device.
(12) A display device, wherein a semiconductor device described in (1) above is formed over a substrate.
(13) A memory device, wherein a semiconductor device described in (1) above is formed over a substrate.

The present invention is not limited to the above-mentioned configurations, and various modifications may be made in accordance with the scope in which it does not deviate from the technological spirit of the present invention.

According to the semiconductor device and the manufacturing method thereof, the improvement in characteristics of the oxide FET and the decrease of the distribution thereof can be made by decreasing the contact resistance, the parasitic resistance, and the variations thereof.

Moreover, by controlling Vth after forming the source region and the drain region or the source electrode and the drain electrode, the reduction in yield in the case of mass-production of a TFT can be suppressed, and process corrections can be made easily.

Moreover, by forming the oxide FETs having different Vth over the same substrate, the degree of freedom of the circuit design can be improved.

Furthermore, by controlling the formation of the back-channel of the bottom-gate type oxide TFT and by decreasing the off-leak current, the current consumption of the semiconductor device can be decreased.

Other advantages according to the present invention will be apparent from the description of the entire specification.

DETAILED DESCRIPTION OF THE PREFERRED EMBODIMENTS

Hereinafter, embodiments of a semiconductor device and a manufacturing method thereof according to the present invention will be described with reference to the drawings.

First Embodiment

Configuration and Manufacturing Method

Figure 1:
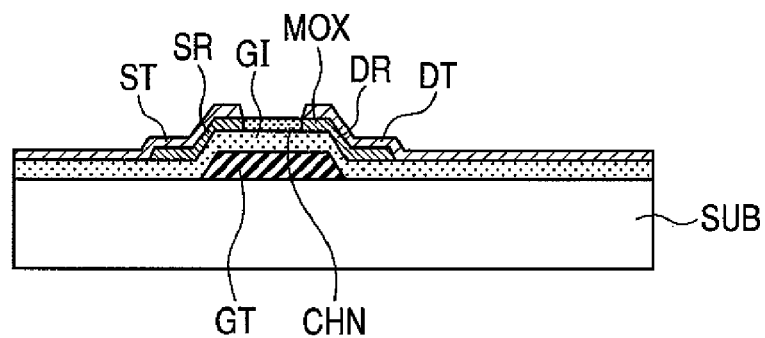
FIG. 1 is a drawing illustrating an embodiment of a configuration of a semiconductor device in the present invention.

FIG. 1 is a configuration illustrating the first embodiment of a semiconductor device according to the present invention. A so-called bottom-gate type oxide TFT is shown as a semiconductor device. As shown in FIG. 1, a gate electrode GT is formed over a substrate SUB. Then, a gate insulator film GI is formed over the top surface of the substrate SUB covering the aforementioned gate electrode GT. In addition, a metallic oxide film MOX is formed over the aforementioned gate insulator film GI extending over at least the aforementioned gate electrode GT. Moreover, a source electrode ST and a drain electrode DT are formed directly in contact with the aforementioned metallic oxide film MOX. The source electrode ST and the drain electrode DT are separated on at least the gate electrode GT and formed opposing each other and existing between this separation part. Herein, the aforementioned metallic oxide film MOX consists of a channel region CHN in the region between the aforementioned source electrode ST and the drain electrode DT; this channel region CHN has semiconductor characteristics; and the oxygen content decreases with depth below the surface.

Figure 1A:
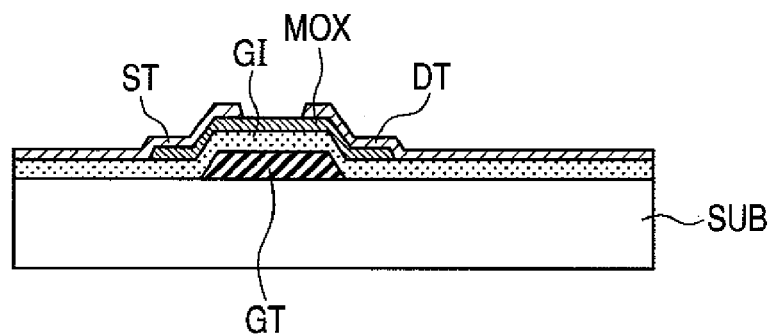
FIG. 1A, FIG. 1B, and FIG. 1C are drawings illustrating an embodiment of a configuration of a manufacturing method of a semiconductor device in the present invention.
Figure 1B:
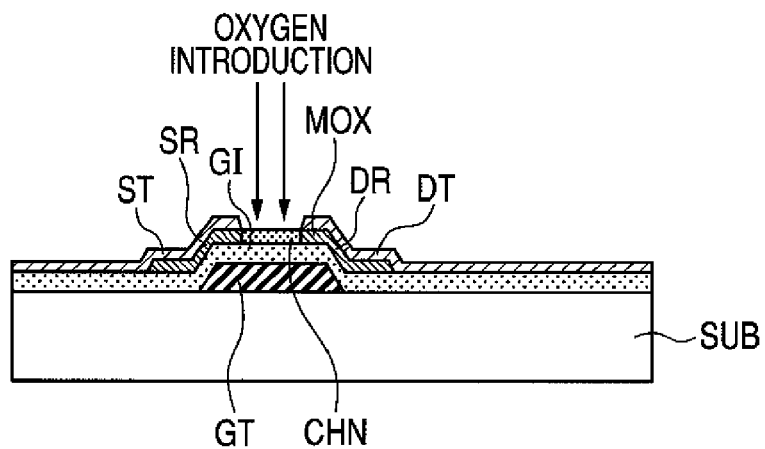

FIGS. 1A and 1B are explanatory drawings illustrating a manufacturing method of a semiconductor device shown in FIG. 1. First of all, the structure illustrated in FIG. 1A is formed by using a general manufacturing process. That is, the gate electrode GT is formed over the substrate SUB. The gate insulator film GI is formed over the top surface of the substrate SUB covering the gate electrode GT. Then, the metallic oxide film MOX is formed over the aforementioned gate insulator film GI extending over at least the aforementioned gate electrode GT. Moreover, a source electrode ST and a drain electrode DT are formed directly in contact with the aforementioned metallic oxide film MOX. The source electrode ST and the drain electrode DT are separated on at least the gate electrode GT and formed opposing each other and existing between the separation part. As a result, the metallic oxide film MOX is exposed outside at the separation part of the source electrode ST and the drain electrode DT.

Next, as shown in FIG. 1B, oxygen is introduced into a part of the metallic oxide film MOX through the aforementioned separation part of the source electrode ST and the drain electrode DT. In this case, the source electrode ST and the drain electrode DT become a mask, and the channel region CHN is formed in the aforementioned metallic oxide film MOX between the source electrode ST and the drain electrode DT. As a method for introducing oxygen, for instance, oxygen plasma irradiation, oxygen atmosphere anneal, and radical oxidation are provided. However, other methods may be used. The region exposed outside of the metallic oxide film MOX is changed into a high oxygen content state by introducing oxygen. In the metallic oxide film, oxygen defects act as n-type donors and carrier electrons are created in the film, resulting in the conductivity becoming low. The region with a high oxygen content formed in this manner exhibits semiconductor characteristics and performs the function as the channel region of the oxide TFT. The region in the metallic oxide film MOX, except for the aforementioned channel region CHN, is formed as the source region SR contacting the source electrode ST and the drain region DR contacting the drain electrode DT.

Figure 1C:
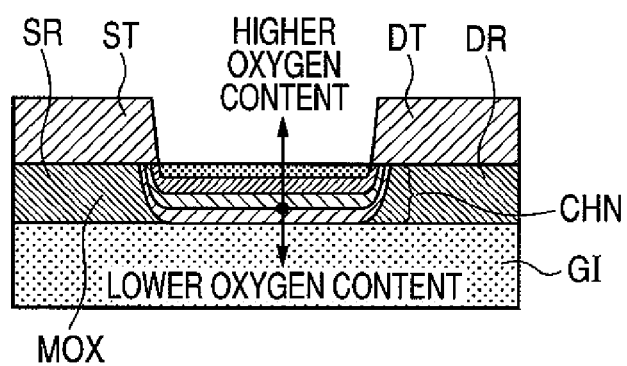

As mentioned above, when the channel region CHN is formed in the metallic oxygen film MOX, oxygen is introduced from the outside (upper side) of the metallic oxide film MOX. Therefore, as shown in FIG. 1C which is an enlarged view of the channel region CHN, the side exposed outside has a relatively high oxygen content and the oxygen content decreases toward the gate insulator film GI side. Although a process in which the oxygen content changes along the depth direction of the metallic oxide film MOX is illustrated as steps for convenience in FIG. 1C, they actually change with smooth gradients. The interface between the gate insulator film GI and the channel region CHN becomes the main part of the channel during TFT operation, and current is mainly carried here. Therefore, it becomes possible that the oxygen content at the interface of the TFT in this embodiment is optimized. In this case, the oxygen content inevitably becomes higher in a vertical direction from the interface. Although it depends on the film thickness and the deposition conditions of the metallic oxide film MOX, it is preferable that the region with the highest oxygen content (the upper layer of the channel region CHN) contain an oxygen content twice or more as compared to the interface. Moreover, it is preferable that it also have a twice or greater oxygen content than the source region SR and the drain region DR. Furthermore, it is preferable that the oxygen content at the interface be made ten times or more than the oxygen content in the source region and drain region, that is, the oxygen content in the upper layer of the channel region CHN is made twenty times or more than the oxygen content in the source region SR and the drain region DR.

The substrate SUB in this embodiment is made of an insulator, for instance, glass, quartz, a plastic film, etc., and the surface of the side where the gate electrode GT is formed is coated by an insulator film, if necessary. The gate electrode GT, the source electrode ST, and the drain electrode DT are formed of, for instance, a single-film of molybdenum, chromium, tungsten, aluminum, copper, titanium, nickel, tantalum, silver, zinc or another metal, an alloy film thereof, a stacked film thereof, a metallic oxide conductive film such as ITO, or a stacked film of the aforementioned metals and a metallic oxide conductive film. The gate electrode GT, the source electrode ST, the drain electrode DT may be formed of the same material or formed of different materials. The insulator film GI is formed of, for instance, $SiO_2$, SiN, $Al_2O_3$, or another insulator film. The metallic oxide film MOX is formed of, for instance, ZnO, InGaZnO, ZnInO, ZnSnO or another metallic oxide exhibiting conductivity.

Figure 2:
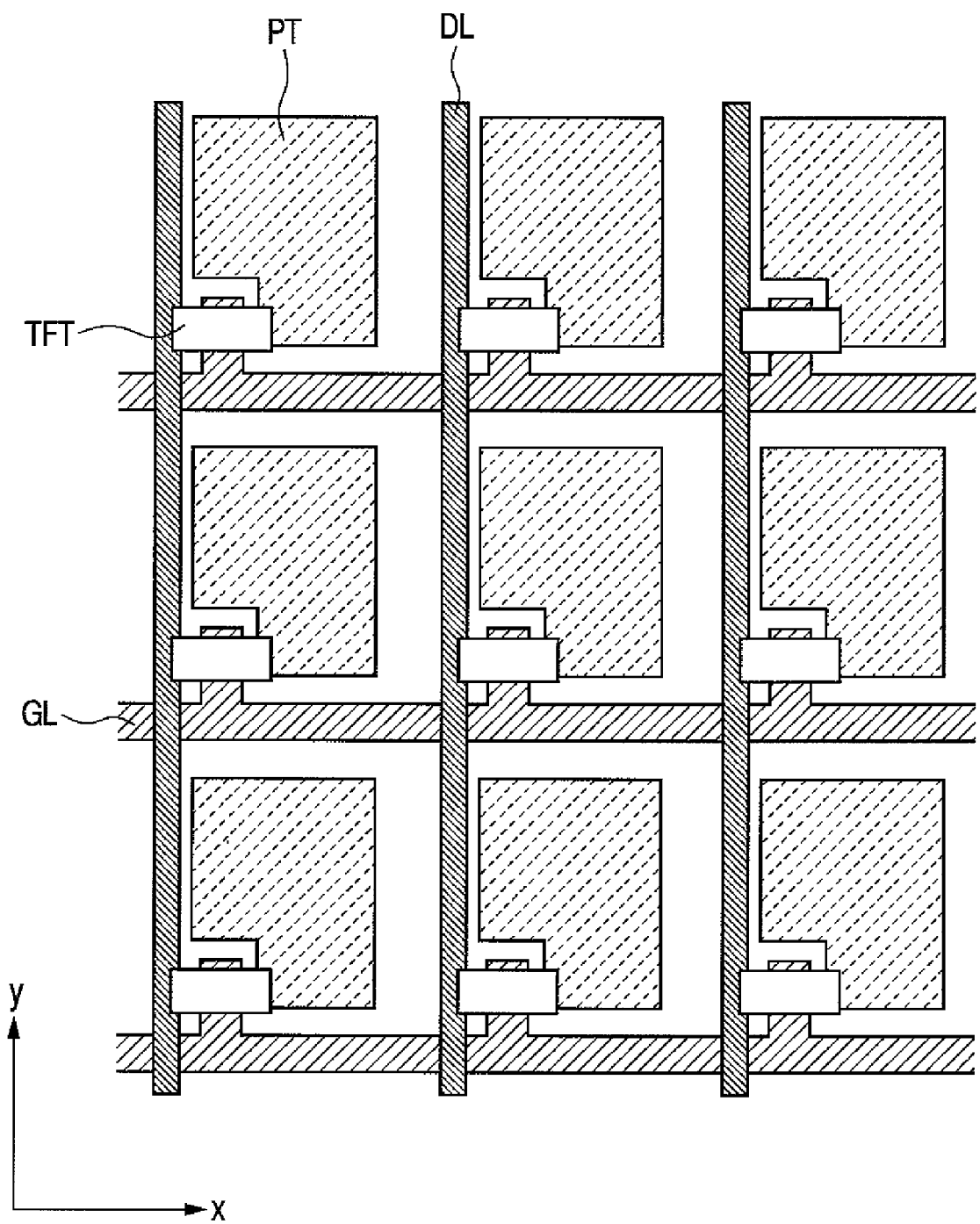
FIG. 2 is a block diagram illustrating an embodiment of a display device to which a semiconductor device in the present invention is applied.

The TFT of this embodiment is used, for instance, as shown in FIG. 2, as a switching transistor of an active-matrix type liquid crystal display device. When a scan signal is supplied to the gate line GL lying in the x direction in the figure, the TFT is turned ON and the image signal from the data line DL lying in the y direction in the figure is supplied to the pixel electrode PT through the TFT which is turned ON. The gate line GL is aligned in the y direction in the figure; the data line DL is aligned in the x direction in the figure; and the aforementioned pixel electrode PT is arranged in the region (pixel region) surrounded by a neighboring pair of gate lines GL and a neighboring pair of drain lines. In this case, for instance, the data line DL is electrically connected to the source electrode ST, and the pixel electrode PT is electrically connected to the drain electrode DT. Or, the data line DL may also work as the source electrode ST, and the pixel electrode PT may work as the drain electrode DT. Moreover, it is not limited to the liquid crystal display device and it may be used as a transistor constituting the pixel circuit such as an OLED display device.

Figure 3:
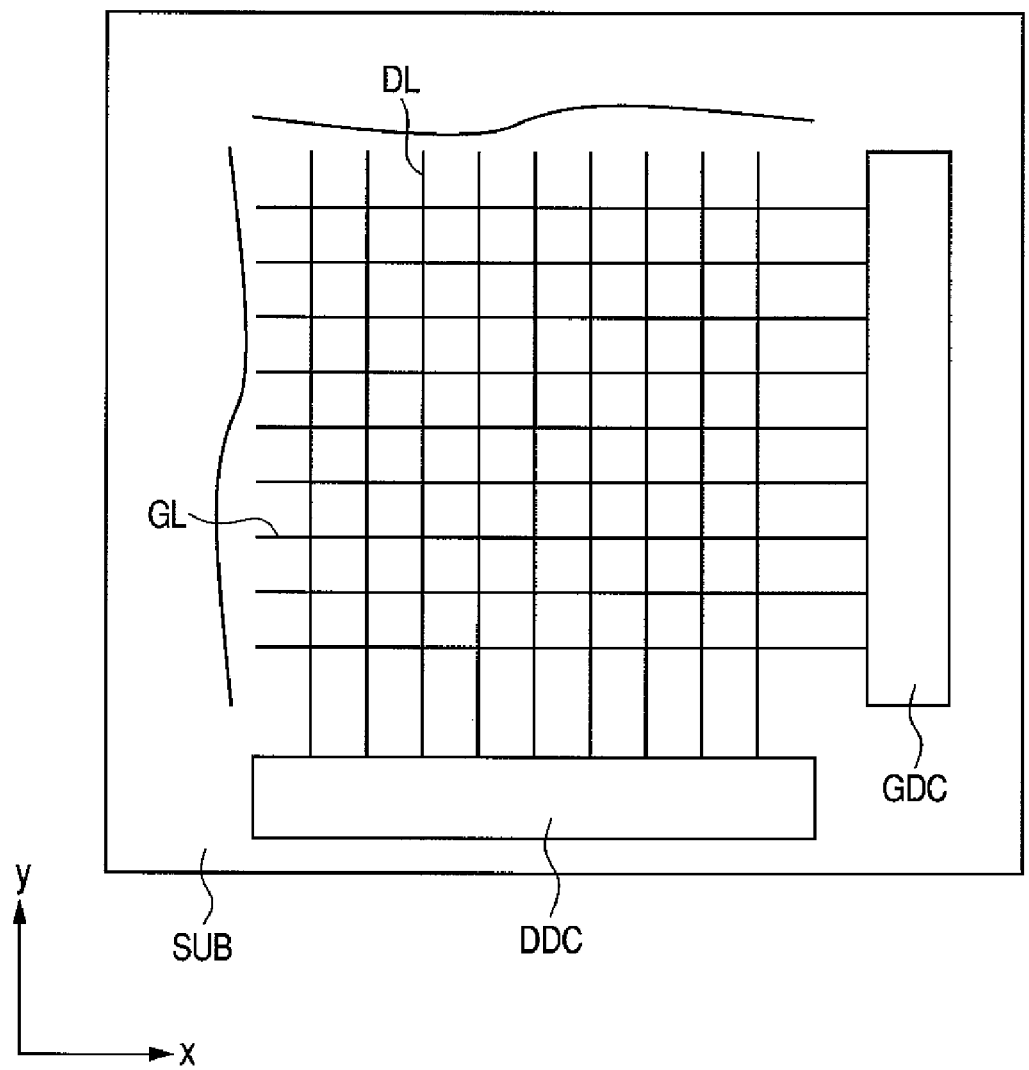
FIG. 3 is a block diagram illustrating an embodiment of an array to which a semiconductor device in the present invention is applied.

Moreover, as shown in FIG. 3, when plural elements are arranged in an array shape in a display device and a memory device formed over the substrate SUB 1, the aforementioned oxide TFT may not only be used for the transistor for switching and driving each element, but also for a gate line driving circuit GDC which sends a signal to the gate line GL connected to the gate electrode GT of the oxide TFT and for a transistor constituting the date line driving circuit DDC which sends a signal to the data line DL connected to the source electrode ST of the oxide TFT. In this case, the oxide TFT of each element and the oxide TFT in the gate line driving circuit GDC or the data line driving circuit DDC may be formed concurrently.

Figure 4:
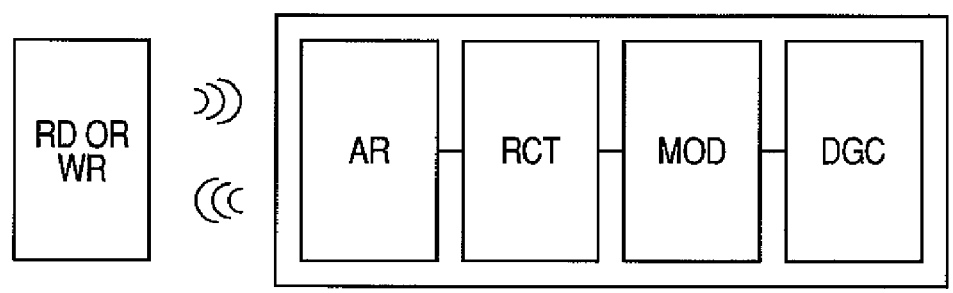
FIG. 4 is a block diagram illustrating an embodiment of a radio tag to which a semiconductor device in the present invention is applied.

Moreover, the aforementioned oxide film TFT may be used for the structure, for instance, shown in FIG. 4, that is, each transistor constituting the radio tag including an antenna resonance circuit AR, a rectifier RCT, a modulator MOD, and a digital circuit DGC. The radio tag can be transmitted by radio with the reader RD and the writer WR. Taking advantage of the low formation temperature of the oxide TFT, it can be applied to a configuration where the display device, the memory device, and the radio tag, etc. are formed over a so-called flexible substrate such as a plastic film.

(Effects)

In this embodiment, for instance, if the metallic oxide film MOX is deposited beforehand as a film with a high conductivity, the parasitic resistance in the source region SR and the drain region DR and the contact resistances between the source region SR and the source electrode ST and between the drain region DR and the drain electrode DT can be made low. As a result, excellent electrical connectivity is obtained and the characteristics of the oxide FET can be improved.

Moreover, the source region SR, the channel region CHN, and the drain region DR are formed self-aligned to the source electrode ST and the drain electrode DT, resulting in the variations in the contact resistance and the parasitic resistance being decreased and consequently, the variations in the TFT being decreased.

Furthermore, it may be possible to form the channel region CHN and control the Vth after the source region SR and the drain region DR, and the source electrode ST and the drain electrode DT are formed. Therefore, the reduction in yield can be suppressed in the case of mass-production of a TFT and process corrections can be made easily.

Moreover, the oxygen content is optimized at the interface between the gate insulator film GI and the channel region CHN and the oxygen content is made higher on the upper side, thereby, it is possible to control the formation of the so-called back channel and to decrease the off-leak current. As a result, the current consumption of the semiconductor device can be decreased.

Second Embodiment

Configuration and Manufacturing Process

Figure 5:
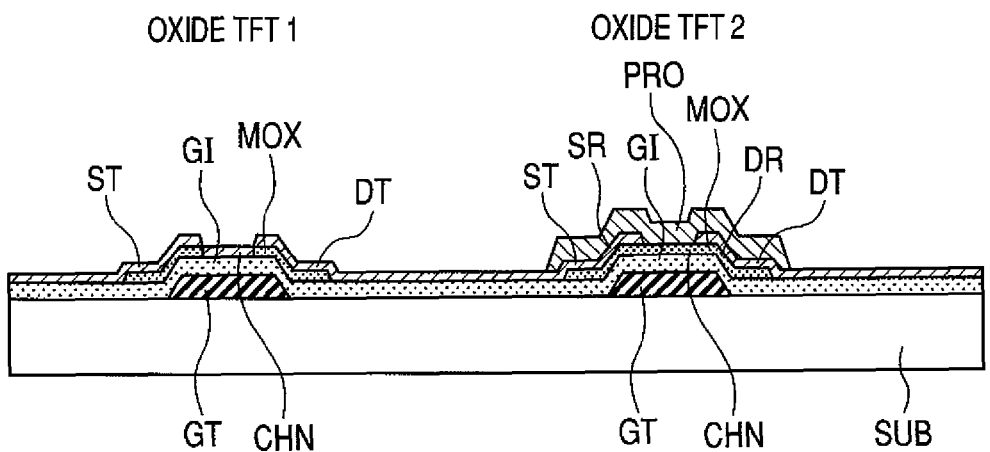
FIG. 5 is a drawing illustrating another embodiment of a configuration of a semiconductor device in the present invention.

FIG. 5 is cross-sectional drawings illustrating the second embodiment of the semiconductor device in the present invention. FIG. 5 is drawings where two kinds of bottom-gate type oxide TFTs with different Vth are formed over the same substrate.

That is, the oxide TFT 1 and the oxide TFT 2 are formed over the top surface of the substrate SUB 1. These oxide TFT 1 and oxide TFT 2 have almost the same stacking structure of the material layers constituting them; the Vth is made higher in the oxide TFT 1; and the Vth is made lower in the oxide TFT 2. That is, the oxygen content introduced into the oxide TFT 1 is made higher than that in the source region SR and the drain region DR in the channel region CHN, and the oxide TFT 2 is formed to have no oxygen content difference from the source region SR and the drain region DR in the channel region CHN.

Figure 5A:
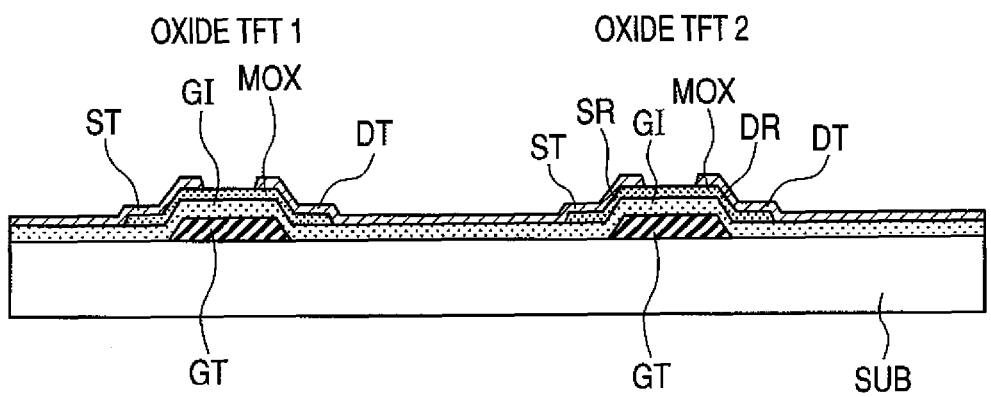
FIG. 5A and FIG. 5B are drawings illustrating another embodiment of a configuration of a manufacturing method of a semiconductor device in the present invention.
Figure 5B:
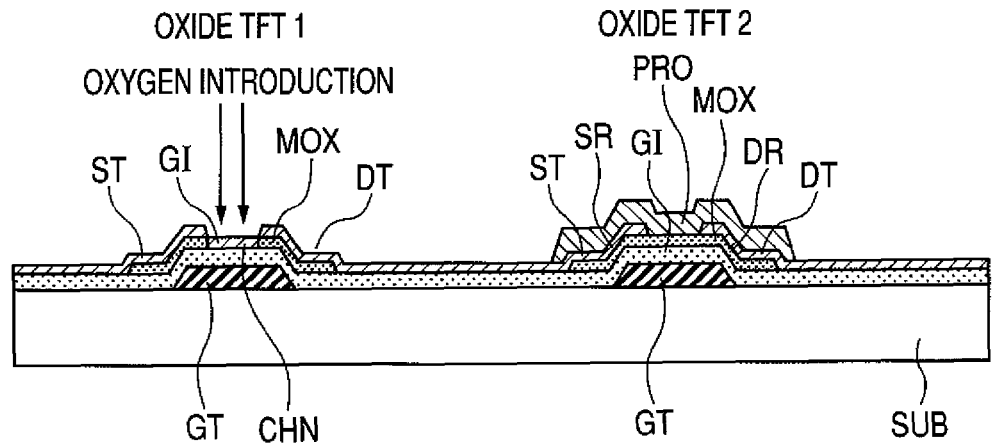

FIGS. 5A and 5B are explanatory drawings illustrating a manufacturing method of a semiconductor device shown in FIG. 5. First of all, the oxide TFT 1 and the oxide TFT 2 are formed to be the structure shown in FIG. 5A by using a general manufacturing process. At this stage, it is one where oxygen is not introduced yet into each channel region of the oxide TFT 1 and the oxide TFT 2. Next, as shown in FIG. 5B, the protection film PRO is formed at least over the channel forming region of the metallic oxide film MOX in the oxide TFT 2. In oxide TFT 1, oxide is introduced into the metallic oxide MOX. As a result, the oxide TFT 1 has a higher oxygen content than the source region SR and the drain region DR in the channel region CHN and high Vth characteristics can be obtained. And, the oxide TFT 2 has little difference in the oxygen contents between the source region, the channel region, and the drain region, and low Vth characteristics can be obtained.

FIG. 5 shows two oxide TFTs including the oxide TFT 1 and the oxide TFT 2 over the substrate SUB 1. However, plural oxide TFT groups which are made to have the same Vth as the aforementioned oxide TFT 1 and plural oxide TFT groups which are made to have the same Vth as the aforementioned oxide TFT 2 are provided, and manufacturing may be performed so as to apply the aforementioned process group-by-group. This kind of manufacturing can be similarly applied to the embodiments from the third embodiment.
(Effects)

In the second embodiment, the degree of freedom of the circuit design can be improved by forming the oxide TFTs having different Vth over the same substrate. Moreover, the effects shown in the first embodiment can be obtained in the oxide TFT 1 with a high Vth.

Third Embodiment

Configuration and Manufacturing Process

Figure 6:
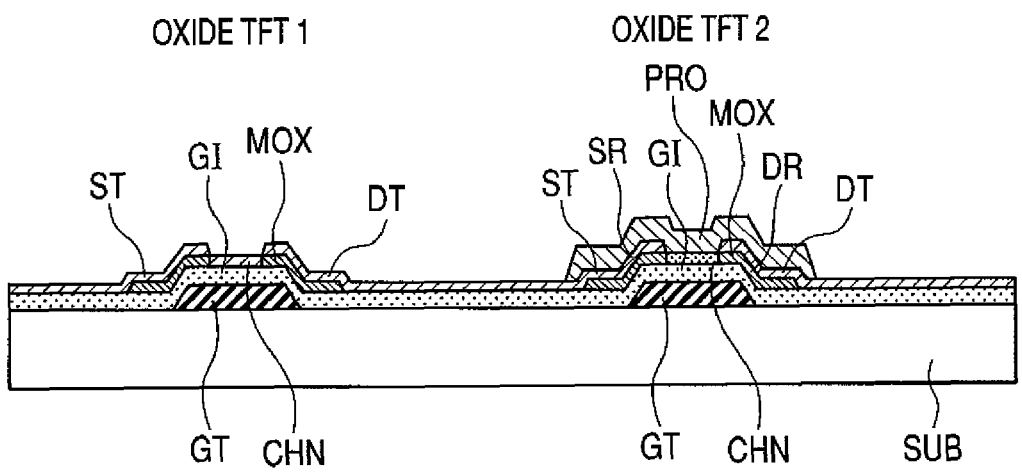
FIG. 6 is drawing illustrating another embodiment of a configuration of a semiconductor device in the present invention.

FIG. 6 is cross-sectional drawings illustrating the third embodiment of the semiconductor device in the present invention and they are drawings corresponding to FIG. 5. As well as the case of FIG. 5, FIG. 6 is drawings where two kinds of bottom-gate type oxide TFTs with different Vth are formed over the same substrate. The configuration which is different from the case of FIG. 5 is that oxygen is introduced into the channel region CHN in the oxide TFT 2 and the content thereof is made lower than the oxygen content of the channel region CHN in the oxide TFT 1.

Figure 6A:
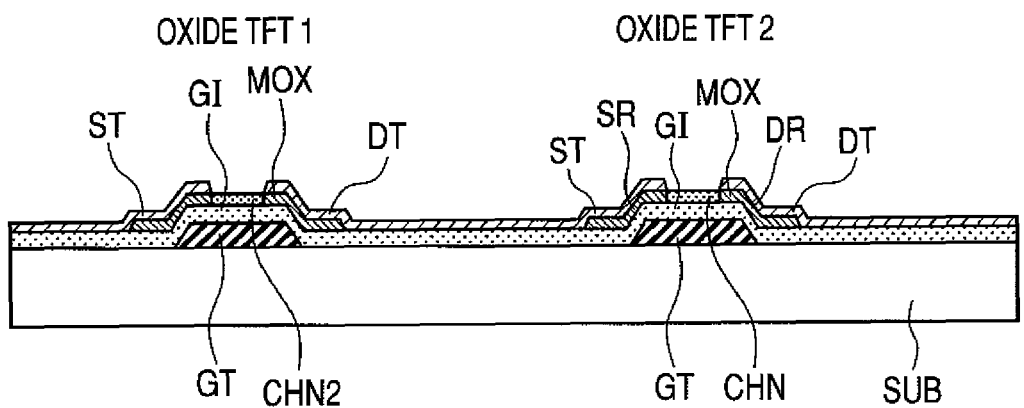
FIG. 6A and FIG. 6B are drawings illustrating another embodiment of a configuration of a manufacturing method of a semiconductor device in the present invention.
Figure 6B:
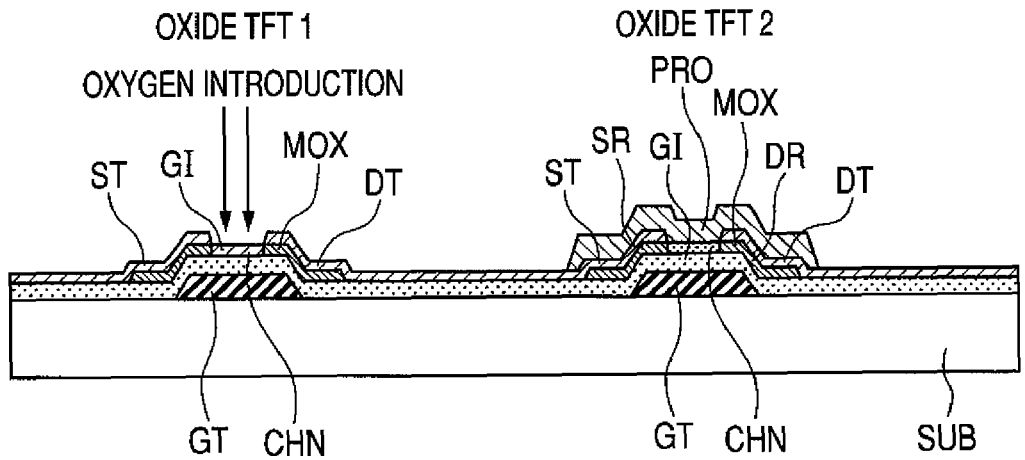

FIGS. 6A and 6B are explanatory drawings illustrating a manufacturing method of a semiconductor device shown in FIG. 6. First of all, the oxide TFT 1 and the oxide TFT 2 are formed to be the structure shown in FIG. 1B by using a general manufacturing process and the manufacturing process disclosed in this specification (FIG. 6A). At this stage, the same amount of oxygen is introduced into each channel region of the oxide TFT 1 and the oxide TFT 2. Next, as shown in FIG. 6B, the protection film PRO is formed at least over the channel forming region of the metallic oxide film MOX in the oxide TFT 2. In the oxide TFT 1, oxygen is introduced into the metallic oxide MOX. As a result, the oxygen content of the channel region in the oxide TFT 1 can be made higher than the source region SR and the drain region DR, and the oxygen content of the channel region in the oxide TFT 2 can be made higher than the source region SR and the drain region DR. The channel region CHN in the oxide TFT 1 has a higher oxygen content than the channel region CHN in the oxide TFT 2.
(Effects)

In this embodiment, the degree of freedom of the circuit design can be improved by forming the oxide TFTs having different Vth over the same substrate. Moreover, compared with the second embodiment, there is an advantage that the effects shown in the first embodiment can be obtained in both the oxide TFT 1 and the oxide TFT 2.

Fourth Embodiment

Configuration and Manufacturing Process

Figure 7:
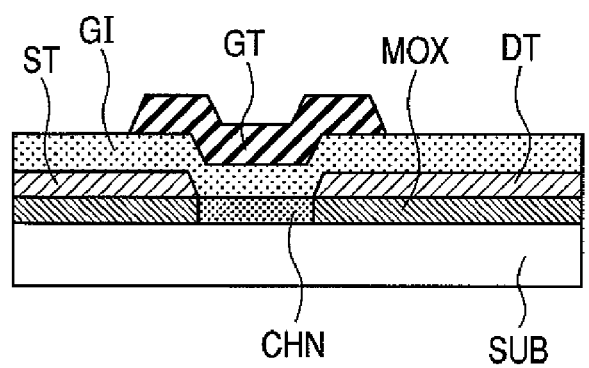
FIG. 7 is a drawing illustrating another embodiment of a configuration of a semiconductor device in the present invention.

FIG. 7 is cross-sectional drawings illustrating the fourth embodiment of the semiconductor device in the present invention. FIG. 7 shows a top-gate type oxide TFT. In FIG. 7, there is a substrate SUB and the metallic oxide film MOX is formed over the top surface thereof. The metallic oxide film MOX is formed as a film, for instance, having a high conductivity and oxygen is introduced into the channel region CHN. The source region and the drain region formed at both sides of the channel region CHN are formed by superimposing the source electrode ST and the drain electrode DT, respectively. The gate insulator film GI is formed covering the channel region CHN, the source electrode ST, and the drain electrode DT, and the gate electrode GT is formed by superimposing at least the channel region CHN over the top surface of the gate insulator film GI.

Figure 7A:
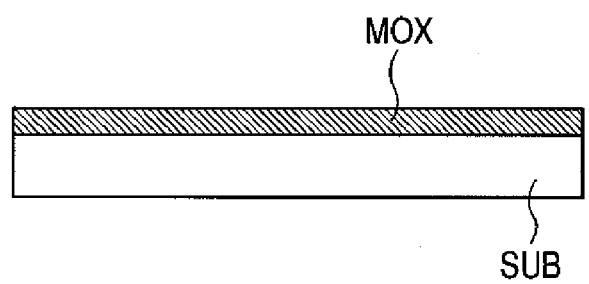
FIG. 7A, FIG. 7B and FIG. C are drawings illustrating another embodiment of a configuration of a manufacturing method of a semiconductor device in the present invention.
Figure 7B:
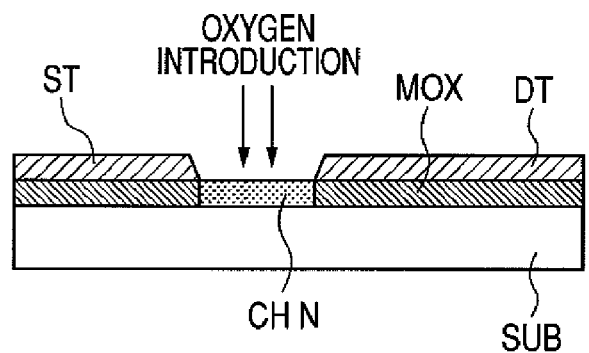
Figure 7C:
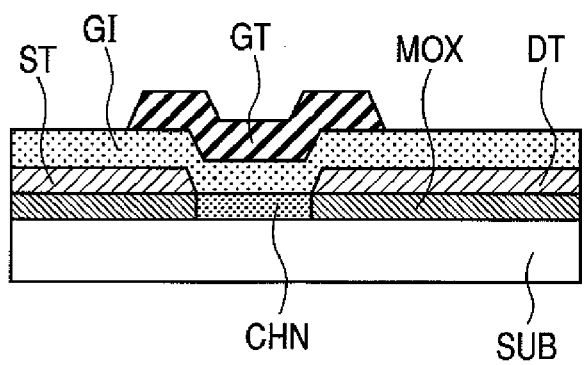

The semiconductor device constituted in this fashion is manufactured, for instance, as follows. As shown in FIG. 7A, the metallic oxide film MOX is formed over the top surface of the substrate SUB. Next, as shown in FIG. 7B, the metallic film is formed over the top surface of the metallic oxide film MOX, and the source electrode ST and the drain electrode DT are formed by patterning the metallic film. Oxygen is introduced into the channel region CHN between the source electrode ST and the drain electrode DT by using the source electrode ST and the drain electrode DT as a mask. Next, as shown in FIG. 7C, the gate insulator film GI is formed covering the channel region CHN, the source electrode ST, and the drain electrode DT, and the gate electrode GT is formed by superimposing the channel region CHN over the top surface of the gate insulator film GI.
(Effects)

In the fourth embodiment, for instance, if the metallic oxide film MOX is deposited beforehand as a film with a high conductivity, the parasitic resistance in the source region SR and the drain region DR and the contact resistances between the source region SR and the source electrode ST and between the drain region DR and the drain electrode DT can be made low. As a result, excellent electrical connectivity can be obtained and the characteristics of the oxide FFT can be improved. Moreover, the source region SR, the channel region CHN, and the drain region DR can be formed self-aligned to the source electrode ST and the drain electrode DT, resulting in the variations in the contact resistance and the parasitic resistance being decreased and consequently, the variations in the TFT being decreased. Furthermore, it may be possible to form the channel region CHN and control the Vth after the source region SR and the drain region DR, and the source electrode ST and the drain electrode DT are formed.

Therefore, the reduction in yield can be suppressed in the case of mass-production of a TFT and process corrections can be made easily.

Fifth Embodiment

Configuration and Manufacturing Process

Figure 8:
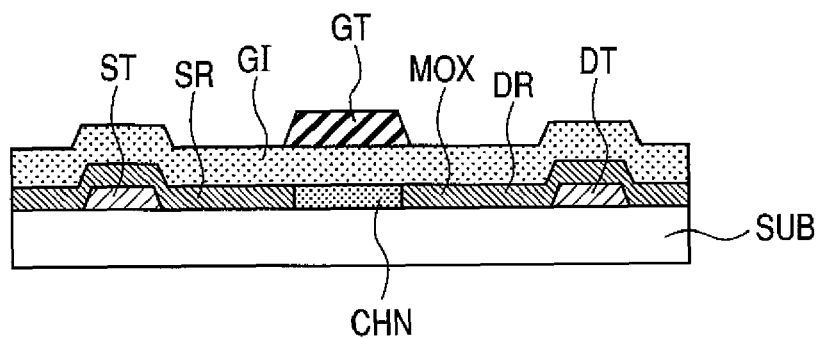
FIG. 8 is a drawing illustrating another embodiment of a configuration of a semiconductor device in the present invention.

FIG. 8 is cross-sectional drawings illustrating the fifth embodiment of the semiconductor device in the present invention. FIG. 8 shows a top-gate type oxide TFT. In FIG. 8, there is a substrate SUB and the source electrode ST and the drain electrode DT are formed over the top surface thereof. Covering the source electrode ST and the drain electrode DT, the metallic oxide film MOX is formed at the region between the source electrode ST and the drain electrode DT. The metallic oxide film MOX is formed as a film, for instance, having a high conductivity and the channel region CHN is formed at a part of the region between the source electrode ST and the drain electrode DT. Oxygen is introduced into the channel region CHN. Next, the gate insulator film GI is formed covering the channel region CHN, the source electrode ST, and the drain electrode DT, and the gate electrode GT is formed by superimposing at least the channel region CHN over the top surface of the gate insulator film GI.

Figure 8A:
FIG. 8A, FIG. 8B, FIG. 8C and FIG. 8D are drawings illustrating another embodiment of a configuration of a manufacturing method of a semiconductor device in the present invention.
Figure 8B:
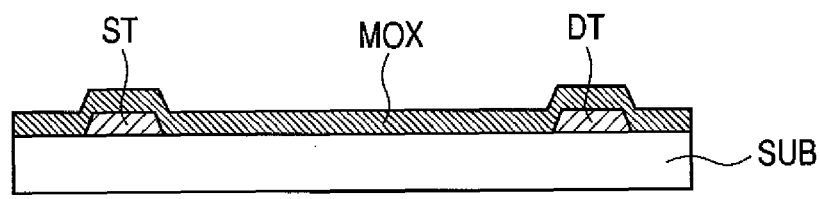
Figure 8C:
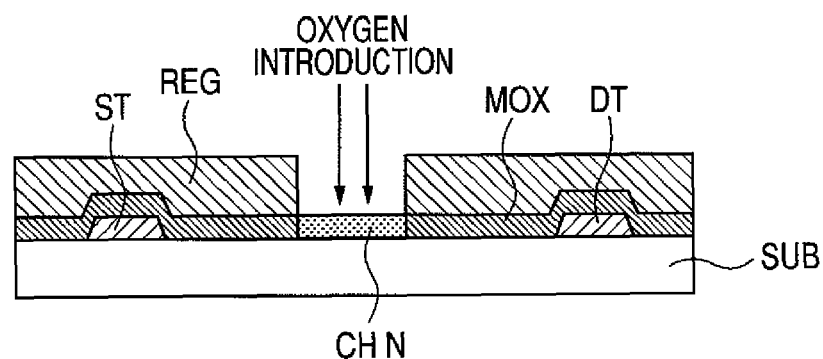
Figure 8D:
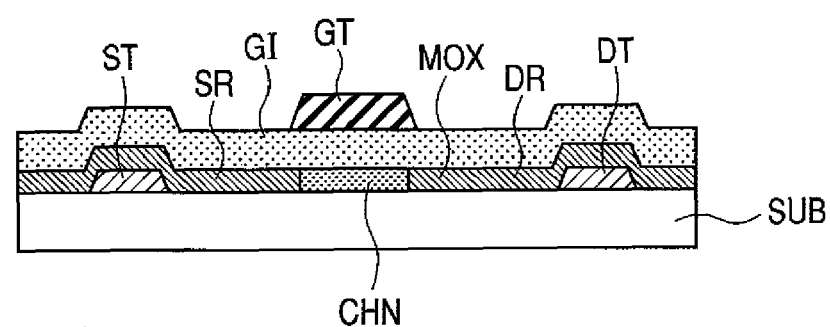

The semiconductor device constituted like this is manufactured, for instance, as follows. As shown in FIG. 8A, the source electrode ST and the drain electrode DT are formed over the top surface of the substrate SUB. Next, as shown in FIG. 8B, covering the source electrode ST and the drain electrode DT, the metallic oxide film MOX is formed at the region between the source electrode ST and the drain electrode DT. Next, as shown in FIG. 8C, a photoresist film REG is formed. This photoresist film REG has an opening which exposes the region corresponding to the channel region CHN of the metallic oxide film MOX. Oxygen is introduced into the metallic oxide film MOX through the opening to form the channel region CHN. After that, as shown in FIG. 8D, the photoresist film REG is removed and the gate insulator film GI and the gate electrode GT are formed, in order, resulting in it being completed. Although the case of removing the photoresist film REG is shown in FIG. 8D, it is not necessary to remove the photoresist film REG and it may be left as is. It is because it can work as an insulator film.

(Effects)

In the fifth embodiment, for instance, if the metallic oxide film MOX is deposited beforehand as a film with a high conductivity, the parasitic resistance in the source region SR and the drain region DR and the contact resistances between the source region SR and the source electrode ST and between the drain region DR and the drain electrode DT can be made low. As a result, excellent electrical connectivity can be obtained and the characteristics of the oxide TFT can be improved.

Moreover, the source region SR, the channel region CHN, and the drain region DR can be formed self-aligned to the source electrode ST and the drain electrode DT, resulting in the variations of the contact resistance and the parasitic resistance being decreased and consequently, the variations in the TFT being decreased.

Furthermore, it may be possible to form the channel region CHN and control the Vth after the source region SR and the drain region DR, and the source electrode ST and the drain electrode DT are formed. Therefore, the reduction in yield can be suppressed in the case of mass-production of a TFT and process corrections can be made easily.

Up to this point, the present invention has been described referring to the embodiments. However, the configuration explained based on each embodiment is only one example, and it is possible to modify them suitably in accordance with the technological spirit of the present invention. Moreover, the configuration explained in each embodiment may be combined as long as it does not mutually contradict.

A semiconductor device and a manufacturing method thereof in each of the aforementioned embodiment can be applied to a transistor and a peripheral circuit which drives each pixel of each liquid crystal display device of a transmission type, a reflex type, and a semitransmission type of an OLED display device, etc. Moreover, it can be applied to a memory element array and a radio tag, etc.

What is claimed is:

1. A semiconductor device including a field-effect transistor using a metallic oxide for a channel,
    wherein said metallic oxide includes a channel region, a source region and drain region, the source and drain regions having a lower oxygen content and higher conductivity than said channel region,
    wherein said channel region exhibits semiconductor characteristics and has an oxygen content that decreases with depth below the surface, and
    wherein the oxygen content in said source and drain regions is constant along the depth direction.

2. A semiconductor device according to claim 1, said field-effect transistor is a bottom-gate type thin film transistor in which a gate electrode, a gate insulator film, a metallic oxide film are formed, in that order, over a substrate, and a source electrode and a drain electrode are formed thereon,
    wherein a region for superimposing said source electrode is said source region in said metallic oxide film,
    wherein a region for superimposing said drain electrode is said drain region in said metallic oxide film, and
    wherein a region between said drain region and said source region is said channel region in said metallic oxide film.

3. A manufacturing method of a semiconductor device according to claim 2,
    wherein said channel region having a higher oxygen content than said source region and said drain region is formed by using said source electrode and said drain electrode for a mask and by introducing oxygen into the metallic oxide film between said source electrode and said drain electrode.

4. A semiconductor device according to claim 1, said field-effect transistor is a top-gate type thin film transistor in which said metallic oxide film is formed over a substrate, a source electrode and a drain electrode are formed thereon and, further thereon, a gate insulator film and a gate electrode are formed, in order,
    wherein a region for superimposing said source electrode is said source region in said metallic oxide film,
    wherein a region for superimposing said drain electrode is said drain region in said metallic oxide film, and
    wherein a region between said drain region and said source region is said channel region in said metallic oxide film.

5. A manufacturing method of a semiconductor device according to claim 4,
    wherein said channel region having a higher oxygen content than said source region and said drain region is formed by using said source electrode and said drain electrode for a mask and by introducing oxygen into the metallic oxide film between said source electrode and said drain electrode.

6. A manufacturing method of a semiconductor device according to claim 1, said field-effect transistor is a top-gate type thin film transistor in which a source electrode and a drain electrode are formed over a substrate, and said metallic oxide film, a gate insulator film, and a gate electrode are formed, in order, thereon
   wherein, after forming said metallic oxide film, a channel region having a higher oxygen content than said source region and said drain region is formed by forming a mask opening a channel-forming region of said metallic oxide film and by introducing oxygen into said metallic oxide film from said opening.

7. A manufacturing method of a semiconductor device according to claim 3,
   wherein introduction of oxygen is carried out by any of oxygen plasma irradiation, oxygen atmosphere anneal, and radical oxidation.

8. A semiconductor device,
   wherein a plurality of semiconductor devices using a metallic oxide film for a channel are formed over the same substrate,
   wherein a first group semiconductor device having a high threshold voltage and a second group semiconductor device having a low threshold voltage are included within the plurality of semiconductor devices, and
   wherein at least the first group semiconductor device is comprised of a semiconductor device according to claim 1.

9. A semiconductor device according to claim 8,
   wherein at least one more insulator film is formed over the channel region of said second group semiconductor device compared to the channel region of said first group semiconductor device.

10. A manufacturing method of a semiconductor device, a first group semiconductor device having a high threshold voltage and a second group semiconductor device having a low threshold voltage being formed over the same substrate,
    wherein a protection film is formed over the channel region of the second group semiconductor device and a manufacturing method according to claim 3 is applied to the manufacture of the first group semiconductor device.

11. A manufacturing method of a semiconductor device, a first group semiconductor device having a high threshold voltage and a second group semiconductor device having a low threshold voltage being formed over the same substrate,
    wherein a manufacturing method according to claim 3 is applied to the second group semiconductor device and a protection film is formed over the channel region of the second group semiconductor device, and
    wherein a manufacturing method according to claim 3 is applied to the first group semiconductor device.

12. A display device, wherein a semiconductor device according to claim 1 is formed over a substrate.

13. A memory device, wherein a semiconductor device according to claim 1 is formed over a substrate.

* * * * *